US006456423B1

(12) United States Patent
Nayfeh et al.

(10) Patent No.: US 6,456,423 B1
(45) Date of Patent: Sep. 24, 2002

(54) SILICON NANOPARTICLE MICROCRYSTAL NONLINEAR OPTICAL DEVICES

(75) Inventors: Munir H. Nayfeh; Gennadiy Belomoin; Nicholas Barry; Osman Akcakir, all of Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/572,121

(22) Filed: May 17, 2000

Related U.S. Application Data (63) Continuation-in-part of application No. 09/426,389, filed on Oct. 22, 1999, and a continuation-in-part of application No. 09/426,204, filed on Oct. 25, 1999.

(51) Int. Cl.[7] ............................. G02F 1/37; G01R 13/40
(52) U.S. Cl. ......................... 359/328; 324/97; 359/326
(58) Field of Search ................................ 359/326–328; 324/96, 97

(56) References Cited

U.S. PATENT DOCUMENTS

| | | | |
|---|---|---|---|
| 4,931,692 A | 6/1990 | Takagi et al. | 313/503 |
| 5,308,804 A | 5/1994 | Lee | 501/17 |
| 5,527,386 A | 6/1996 | Statz | 106/481 |
| 5,561,679 A | 10/1996 | Mannik et al. | 372/43 |
| 5,690,807 A | 11/1997 | Clark, Jr. et al. | 205/655 |
| 5,695,617 A | 12/1997 | Graiver et al. | 204/157.41 |
| 5,714,766 A | 2/1998 | Chen et al. | 257/17 |
| 5,747,180 A * | 5/1998 | Miller et al. | 428/601 |
| 5,770,022 A | 6/1998 | Chang et al. | 204/164 |
| 5,891,548 A | 4/1999 | Graiver et al. | 428/98 |
| 5,932,889 A | 8/1999 | Matsumura et al. | 257/14 |
| 5,942,748 A | 8/1999 | Russell et al. | 250/214.1 |
| 6,038,060 A * | 3/2000 | Crowley | 359/328 |
| 6,060,743 A | 5/2000 | Sugiyama et al. | 257/321 |

OTHER PUBLICATIONS

Erland et al., "Second Harmonic Spectroscopy of Semiconductor Nanostructures", Technical Digest —Summaries of Papers Presented at the Quantum Electronics and Laser Science Conference, May 23–28, 1999, pp. 233–234.*

E. Werwa, A.A. Seraphin and K.D. Kolenbrander, *Excitation Intensity and Temperature Dependent Photoluminescence Behavior of Silicon Nanoparticles*, Material Research Society Symposium Proceedings, vol 452 pp. 129–134, 1997.

R.W. Collins, P.M. Fauchet, I. Shimizu, J.C. Vial, T. Shimada and A.P. Alivisatos, *Luminescence Properties of Silicon Nanocrystals*, Advances in Microcrystalline and Nanocrystaline Semiconductor Symposium, Boston, MA, USA, Dec. 2–6, 1996 (abstract).

Shoutian Li, Stuart J. Silvers and M. Samy El-Shall, *Luminescence Properties of Silicon Nanocrystals*, Material Research Society Symposium Proceedings, vol. 452, pp. 141–146, 1997.

(List continued on next page.)

Primary Examiner—John D. Lee
(74) Attorney, Agent, or Firm—Greer, Burns & Crain, Ltd.

(57) ABSTRACT

Harmonic incident radiation is obtained from a silicon nanoparticle microcrystal or microcrystal film. The preferred film comprises silicon nanoparticles, dimensioned on the order of one nanometer, reconstituted into a device quality crystalline film. The microcrystal film emits the second harmonic of incident radiation for excitations in the range of about 600–1000 nm. A preferred device according to the invention includes a silicon nanoparticle microcrystal film formed on a substrate, such as silicon or glass. Crystals of the silicon nanoparticles, due to the harmonic response, also demonstrate the capability to serve as piezoelectric material and as an improved biological marker. Since the emission response of the silicon nanoparticle crystals will be influenced by surrounding electric fields, the microcrystals also provide for electrochromatic mapping of electric field distribution in general and in electronic devices.

9 Claims, 8 Drawing Sheets

OTHER PUBLICATIONS

Kouichi Murakami and Tetsuya Makimura, *Silicon nanoparticles with visible light emission –Laser ablation–*, Oyo Buturi, vol. 67, No.7. pp. 817–821, Jul. 1998 (with verified translation).

S. T. Yau, D. Saltz, M. H. Nayfeh, "Laser–Assisted Deposition of Nanometer Structures Using Scanning Tunneling Microscope", *Appl. Phys. Lett.*, vol. 57, No. 27, Dec. 31, 1990, pp. 2913–2915.

S.T. Yau, X.Zheng, M.H. Nayfeh, "Nanolithography of Chemically Prepared Si With a Scanning Tunneling Microscope", *Appl. Phys. Lett.*, vol. 59, No. 19, Nov. 4, 1991, pp. 2457–2459.

M. Nayfeh, "Fabrication of Nanometer Scale Structures", SPIE Institutes, vol. IS 10, (1993), pp. 200–217.

D. Andsager, J. Hilliard, J.M. Hetrick, L.H. AbuHassan, M. Plisch, M.H. Nayfeh "Quenching of Porous Silicon Photoluminescence by Deposition of Metal Adsorbates", *J. Appl. Phys.*, vol. 74, No. 7, Oct. 1, 1993, pp. 4783–4785.

J. Hillard, D. Andsager, L. Abu Hassan, H.M. Nafeh, M. H. Nayfeh, "Infrared Spectroscopy and Secondary Ion Mass Spectrometry of Luminescent, Nonluminescent and Metal Quenched Porous Silicon", *J. App. Phys.*, vol. 76, No. 4, Aug. 15, 1994, pp. 2423–2428.

D. Andsager, J. Hilliard, M.H. Nayfeh, "Behavior of Porous Silicon Emission Spectra During Quenching by Immersion in Metal Ion Solution", *Appl. Phys. Lett.*, vol. 64, No. 9, Feb. 28, 1994, pp. 1141–1143.

D. Andsager, J.M. Hetrick, J. Hilliard, M.H. Nayfeh, "Diffusion of Copper in Porous Silicon", *J. of Appl. Phys.*, vol. 77, No. 9, May 1, 1995, pp. 1–4.

J.E. Hilliard, H.M. Nayfeh, M.H. Nayfeh, "Re–Establishment of Photoluminescence in Cu Quenched Porous Silicon by Acid Treatment", *J. App. Phys.*, vol. 77, No. 8, Apr. 15, 1995, pp. 4130–4132.

N. Rigakis, J. Hillard, L. Abu Hassan, J. Hetrick, D. Andsager, M.H. Nayfeh, "Effect of Oxidation Treatments on Photoluminescence Excitation of Porous Silicon", *J. App. Phys.*, vol. 81, No. 1, Jan. 1, 1997, pp. 440–444.

N. Rigakis, Z. Yamani, L. Abu Hassan, J. Hilliard, M.H. Nayfeh, "Time–Resolved Measurements of the Photoluminescence of Cu–Quenched Porous Silicon", *Appl. Phys. Lett.*, vol. 69, 1996, pp. 2216–2218.

W.H. Thompson, Z. Yamani, L.H. Abu Hassan, J.E. Greene, M. Nayfeh, "Room Temperature Oxidation Enhancement of Porous Si(001) Using Ultraviolet–Ozone Exposure", *J. Appl. Phys.*, vol. 80, No. 9, Nov. 1, 1996, pp. 5415–5421.

Z. Yamani, W.H. Thompson, L. Abu Hassan, M.H. Nayfeh, "Ideal Anodization of Silicon", *Appl. Phys. Lett.*, vol. 70, No. 25, Jun. 23, 1997, pp. 3404–3406.

M.H. Nayfeh, N. Rigakis, Z. Yamani, "Photoexcitation of Si–Si Surface States in Nanocrystallites", *Physical Review B*, vol. 56, No. 4, Jul. 15, 1997, pp. 2079–2084.

Z. Yamani, S. Ashhab, A. Nayfeh, W.H. Thompson, M. Nayfeh, "Red to Green Rainbow Photoluminescence from Unoxidized Silicon Nanocrystallites", *J. App. Phys.*, vol. 83, No. 7, Apr. 1, 1998, pp. 3929–3931.

Z. Yamani, N. Rigakis, M.H. Nayfeh, "Excitation of Size Selected Nanocrystallines in Porous Silicon", *Appl. Phys. Lett.*, vol. 72, No. 20, May 18, 1998, pp. 2556–2558.

W.H. Thompson, Z. Yamani, L. Abu Hassan, O. Gurdal, M. Nayfeh, "The Effect of Ultrathin Oxides on Luminescent Silicon Nanocrystallites", *Appl. Phys. Lett.*, vol. 73, No. 6, Aug. 10, 1998, pp. 841–843.

M.H. Nayfeh, N. Rigakis, Z. Yamani, "Photoexcitation of Si–Si Radiative Surface States in Nanocrystallites", Mater. Res. Soc. Symp. Proc., Boston, MA, 1997, vol. 486, pp. 243–248.

M.H. Nayfeh, Z. Yamani, O. Gurdal, A. Alaql, "Nanostructure of Porous using Transmission Microscopy", Mater. Res. Soc. Symp. Proc., Boston, MA, 1998, vol. 536, pp. 1–6.

Z. Yamani, A. Alaql, J. Therrien, O. Nayfeh, M. Nayeh, "Revival of Interband Crystallite Reflectance from Nano crystallites in Porous Silicon by Immersion Plating", *Appl. Phys. Lett.*, vol. 74, No. 23, Jun. 7, 1999, pp. 3483–85.

Z. Yamani, O. Gurdal, A. Alaql, M.H. Nayfeh, "Correlation of Diffuse Scattering with Nanocrystallite Size in Porous Silicon Using Transmission Microscopy", *J. Appl. Phys.*, vol. 85, No. 12, Jun. 15, 1999, pp. 8050–8053.

L.T. Canham, "Silicon Quantum Wire Array Fabrication by Electrochemical and Chemical Dissolution of Wafers", *Appl. Phys. Lett.*, vol. 57, No. 10, Sep. 3, 1990, pp. 1046–1048.

A.G. Cullis, L.T. Canham, P.D.J. Calcott, "The Structural and Luminescence Properties of Porous Silicon", *J. Appl. Phys.*, vol. 82, No. 3, Aug. 1, 1997, pp. 909–965.

J. Wang, H.B. Jiang, W.C. Wang, J.B. Zheng, F.L. Zhang, P.H. Hao, X.Y Hou, X. Wang, "Efficient Infrared–Up–Conversion Luminescence in Porous Silicon: A Quantum–Confinement–Induced Effect", *Phys. Rev. Lett.*, vol 69, No. 22, Nov. 30, 1992, pp. 3252–3255.

J. Gole, D. Dixon, "Evidence for Oxide Formation from the Single and Multiphoton Excitation of a Porous Silicon Surface or Silicon 'Nanoparticles'", *J. Appl. Phys.*, vol. 83, No. 11, Jun. 1, 1998, pp. 5985–5991.

F. Koch, "Models and Mechanisms for the Luminescence of Porous Si", Mater. Res. Soc. Symp. Proc., pp. 319–329, vol. 298 (1993).

R.P. Chin, Y.R. Shen, V. Petrova–Koch, "Photoluminescence from Porous Silicon by Infrared Multiphoton Excitation" *Science*, vol. 270, Nov. 3, 1995, pp. 776–778.

S.I. Raider, R. Flitsch, M.J. Palmer, "Oxide Growth on Etched Silicon in Air at Room Temperature", *J. Electrochem. Soc.*, vol. 122, No. 3, Mar. 1975, pp. 413–418.

U. Neuwald, A. Feltz, U. Memmert, R.J. Behm, "Chemical Oxidation of Hydrogen Passivated Si(111) Surfaces in $H_2O_2$", *J. Appl. Phys.*, vol. 78, No. 6, Sep. 15, 1995, pp. 4131–4136.

A. Pasquarello, M.S. Hybertsen, R. Car, "Si 2p Core–Level Shifts at the Si(001)–$SiO_2$ Interface: A First–Principles Study", *Phys. Rev. Lett.*, vol. 74, No. 6, Feb. 6, 1995, pp. 1024–1027.

M.H. Nayfeh, N. Rigakis, Z. Yamani, "Photoexcitation of Si–Si Radiative Surface States in Nanocrysatallites", Mat. Res. Soc. Symp. Proc., vol. 486, pp. 243–248. (1998).

Z. Yamani, A. Alaql, J. Therrien, O. Nayfeh, M. Nayfeh, "Revival of Interband Crystalline Reflectance from Nanocrystallites in Porous Silicon by Immersion Plating", *Appl. Phys. Lett.*, vol. 74, No. 23, Jun. 7, 1999, pp. 3483–3485.

E. Hanamura, "Very Large Optical Nonlinearity of Semiconductor Microcrystallites", *Physical Rev. B*, vol. 37, No. 3, Jan. 15, 1988, pp. 1273–1279.

G. Allan, C. Delerue, M. Lannoo, "Nature of Luminescent Surface States of Semiconductor Nanocrystallites", *Physical Rev. Lett.*, vol. 76, No. 16, Apr. 15, 1996, pp. 2961–2964.

J.L. Heinrich, C.L. Curtis, G.M. Credo, K.L. Kavanagh, M.J. Sailor, "Luminescent Colloidal Silicon Suspensions from Porous Silicon", *Science*, vol. 255, Jan. 3, 1992, pp. 66–68.

Sandip Tiwari, Farhan Rana, Hussein Hanafi, Allan Hartstein, Emmanuel F. Crabbe, and Kevin Chan, "A silicon nanocrystals based memory", Appl. Phys. Lett. 68(10), Mar. 4, 1996, pp. 1377–79.

G.M. Credo, M.D. Mason, and S.K. Buratto, "External quantum efficiency of single porous silicon nanoparticles", Applied Physics Letters, vol. 74, No. 14, Apr. 5, 1999, pp. 1978–1980.

L. Pavesl, C. Dal Negro, Mazzoleni, G. Franzo and F. Prlolo, "Optical gain in silicon nanocrystals", Nature, vol. 408, Nov. 23, 2000, pp. 440–443.

D.J. DiMaria, J.R. Kirtley, E.J. Pakulis, D.W. Dong, T.S. Kuan, F.L. Pesavento, T.N. Theis, J.A. Cutro, and S.D. Brorson, "Electroluminescence studies in silicon dioxide films containing tiny silicon islands", J. Appl. Phys., vol. 56, No. 2, Jul. 15, 1984, pp. 401–416.

S. Juen, K. Überbacher, J. Baldauf, K.F. Lamprecht, R. Tessadri, R. Lackner, R.A. Höpfel, "Technology and Photoluminescence of GaAs Micro–and Nanocrystallites", Superlattices and Microstructures, vol. 11, No. 2, 1992, pp. 181–184.

K.A. Littau, P.J. Szajowski, A.J. Muller, A.R. Kortan, and L.E. Brus, "A Luminescent Silicon Nanocrystal Colloid via a High–Temperature Aerosol Reaction", The Journal of Physical Chemistry, vol. 97, No. 6, 1993, pp. 1224–1230.

Anton Fotjik, Arnim Henglein, "Luminescent colloidal silicon particles", Chemical Physics Letters 221, Apr. 29, 1994, pp. 363–367.

L.A. Chiu, A.A. Seraphin, and K.D. Kolenbrander, "Gas Phase Synthesis and Processing of Silicon Nanocrystallites: Characterization by Photoluminescence Emission Spectroscopy", Journal of Electronic Materials, vol. 23, No. 3, 1994, pp. 347–354.

Xinwei Zhao, Olaf Schoenfeld, Jun–ichi Kusano, Yoshinobu Aoyagi and Takuo Sugano, "Observation of Direct Transitions in Silicon Nanocrystallites", Jpn, J. Appl. Phys., vol. 33, Jul. 1, 1994, Pt. 2, No. 7A, pp. L899–L901.

Shoutian Li, I.N. Germanenko, M.S. El Shall, "Semiconductor nanoparticles in contact: quenching of the photoluminescence from silicon nanocrystals by WO3 nanoparticles suspended in solution", Journal of Physical Chemistry B, vol. 102, No. 38, pp. 7319–7322, Sep. 17, 1998 (Abstract).

Melnikov et al, "Hyper–Rayleigh Scattering From A Three–Dimensional Disordered Array Of Metal Nanoparticles", 1998 Quantum Electronics Conference (IQEC 98), Technical Digest, pp. 173–174, paper QThF3, May 1998.*

* cited by examiner

SILICON NANOPARTICLE MICROCRYSTAL NONLINEAR OPTICAL DEVICES

REFERENCE TO RELATED APPLICATIONS

This application is a continuation-in-part of a prior application to Nayfeh et al, Ser. No. 09/426,389, entitled SILICON NANOPARTICLES AND METHOD FOR PRODUCING THE SAME, filed on Oct. 22, 1999, and a continuation-in-part of prior application to Nayfeh et al., Ser. No. 09/426,204, entitled SILICON NANOPARTICLE STIMULATED EMISSION DEVICES, filed on Oct. 25, 1999. Priority is claimed from those applications under 35 U.S.C. §120, and those applications are incorporated by reference herein. Another commonly owned application concerning silicon nanoparticles is the application to Nayfeh et al. Ser. No. 09/496,506, filed on Feb. 2, 2000 and entitled SILICON NANOPARTICLE FIELD EFFECT TRANSISTOR AND TRANSISTOR MEMORY DEVICE.

FIELD OF THE INVENTION

The present invention is in the nonlinear optical field, and particularly concerns nonlinear processes to extend or alter the frequency regime of laser radiation, monitor electric fields, and provide electric-based motion control. The second harmonic response of silicon nanoparticle microcystals also provides a basis for sensors in biological applications, namely, second harmonic imaging applications.

BACKGROUND OF THE INVENTION

Controlled lasers are the basis for a wide variety of modern devices useful in fields ranging from medical devices, such as surgical lasers, to communication devices that use light as a data carrier instead of electricity. Reliance on optical energy, and particularly laser radiation, continues to increase. Optical systems, compared to electrical systems, have higher data carrying capacity, do not suffer from electromagnetic interference, are faster, and have many other benefits known to those skilled in the art.

Semiconductor lasers produce laser light from a semiconductor structure. Such devices emit laser lights at a frequency inherent to the material used, typically, Group III–V semiconductors. Altering, and particularly increasing, the frequency expands device usefulness. Extra frequencies offer increased communication or bands, for example, and higher frequency lasers perform work more efficiently.

In general, the nonlinear polarization for a material can be expressed as $P=\chi^{(1)}E^1+\chi^{(2)}E^2+\chi^{(3)}E^3$ . . . where P is the induced polarization, $\chi^{(n)}$ is the nth order nonlinear susceptibility, and E is the electric field vector. The first term describes normal absorption and reflection of light; the second term describes the second harmonic generation (SHG), sum and difference frequency generation; and the third, describes light scattering, stimulated Raman processes, third harmonic generation (THG), both two- and three-photon absorption. SHG does not arise from an absorptive process. Instead, an intense laser field induces a nonlinear polarization in a molecule or assembly of molecules, resulting in the production of a coherent wave at exactly twice the incident frequency (half the wavelength). The magnitude of the SHG wave can be resonance enhanced when the energy of the photon energy of the second harmonic wave overlaps with an electronic absorption band.

A major constraint of SHG is the requirement of a noncentrosymmetric environment. This is readily understood as follows. The second harmonic wave is a vector quantity, and within the electric dipole approximation, the induced polarization in a centrosymmetric sample from one direction would be equal and opposite the other, thus canceling. Efficient crystals used today in harmonic generation include $KH_2PO_4$ (KDP), $NH_4H_2PO_4$ (ADP), $LiNbO_3$, $Ba_2NaNb_5O_{15}$. The crystals are hydrophilic, requiring encapsulation in phase matched materials, and they are plagued by incident laser and temperature damage.

There has been recent interest in the nonlinear optical response in silicon nano material. The activity in silicon was stimulated by the discovery of the optical activity of porous silicon and the associated nanoscale structure of the material. In measurements by Wang et. al. using 50 picosecond pulsed 1.06 $\mu$m excitation, it was suggested that a third harmonic photon (at 355 nm) is first generated in the core of the nanostructures. The photoluminescence is then produced by a single photon excitation by the internally generated UV radiation. However, no radiation at the third harmonic was directly detectable in these experiments. More recent measurements by Chin et al. using short pulse at 0.870, 1.06 and 1.3 $\mu$m radiation there was no evidence for second or third harmonic generation. The internal generation of second harmonic photon was ruled out since second harmonic generation is not allowed in bulk silicon due to the centrosymmetry. On the theoretical side, silicon is known to have negligible nonlinearity, being zero at the second order level (not allowed), and very small at the third order level. However, calculations show that the nonlinear polarizability of semiconductors may be greatly enhanced, by several order of magnitude, over bulk values when the crystallite size is reduced to the nano meter regime. However, for systems of large dielectric constants and small effective masses such as silicon, it was ruled out. It was argued excitonic Bohr radius is as large as 4 nm, and the quantization energies of the unbound electron and hole become, in ultrasmall nanoparticles (1–3 nm across), easily larger than the exciton binding energy so that the conditions for enhancement are not satisfied.

Thus, there is a need for improved nonlinear optical devices. There is a further need for a method for harmonic generation, and an improved crystal structure for harmonic generation.

SUMMARY OF THE INVENTION

The present invention is directed to these needs, and meets the needs by demonstrating nonlinear optical devices and harmonic generation based upon silicon nanoparticle microcrystal structures. The nonlinear response of silicon microcrystals provides for frequency doubling at incident wavelengths from about 600 nm to 1000 nm and frequency mixing is also provided at the same range of incident wavelengths.

We report the first observation of second harmonic generation in microcrystals of ultrasmall silicon nanoparticles of the invention. The results are surprising since harmonic generation is not allowed in bulk silicon due to the centrosymmetry and theory predicts similar behavior for other forms of silicon.

The present invention relies upon a previously unknown material, silicon nanoparticles. This new material and a method for making the same are described in copending application serial number Ser. No. 09/426,389, to Nayfeh et al. entitled SILICON NANOPARTICLES AND METHOD OF MAKING THE SAME, which is incorporated by reference herein. Electrochemical etched silicon is dispersed into a suspension nano particle colloid of ~1 nm across. The particles of the invention were then reconstituted to create large, thick, uniform film layers of faceted microcrystallites. This type of microcrystals and films thereof emit the second harmonic of incident radiation, which has also been observed from individual microcrystals of the invention. The silicon nanoparticle microcrystal is accordingly the basis for many nonlinear optical devices.

Particular devices of the invention include frequency doublers and frequency mixers. Doublers and mixers may be incorporated in many optoelectronic applications. In addition, the frequency response of silicon microcrystals of the invention provides a basis for an electrochromatic semiconductor device usable, for example, to measure electric fields. The microcrystals also exhibit piezoelectric characteristics, providing a new piezoelectric material suitable, for example, for electric based motion control. Because nonlinear emission is coherently related to the incident, collimated, and of width that is basically limited by the bandwidth of the incident radiation, it can provide superior detection capabilities as a biosensing marker, improving the signal to background tremendously in second harmonic imaging (SHIM).

BRIEF DESCRIPTION OF THE DRAWINGS

Other features, objects, and advantages of the invention will be apparent by reference to the detailed description and the drawings, of which.

DETAILED DESCRIPTION OF THE INVENTION

The present invention is in the nonlinear optical field in which nonlinear processes extend the frequency regime of laser radiation. This has broad utility and may be used, for example, in optical communication systems or to provide electric-based motion control. According to the invention, harmonic generation at twice the frequency of near infrared radiation has been generated, and frequency up shifted beams by stimulated anti-Stokes processes have been generated. No such capability has been previously demonstrated from silicon, and is produced in the invention through a new class of material, referred to herein as silicon nanoparticles. Silicon nanoparticles are elemental silicon particles dimensioned on the order of one nanometer.

Films of silicon nanoparticle microcrystals were produced and have demonstrated harmonic generation. Electrochemical etched silicon was dispersed into a suspension nano particle colloid of ~1 nm across. The particles were then reconstituted to create large, thick, uniform layers of faceted micro-crystallites on device quality Si substrates, glass or parafarin. The microcrystallites may be retained on a substrate. They may also be removed to form a free-standing configuration. In addition, they may be repackaged according to need or application. Microcrystals and microcrystal films were excited by near-infrared femtosecond two photon process. We have observed narrow emission at twice the frequency of the incident radiation, i.e., second harmonic generation of the incident radiation. Moreover, we report on the production of another beam slightly up shifted in frequency from the second harmonic beam. This beam is due to stimulated anti-Stokes emission via the Raman scattering process.

Nonlinear optical processes in the silicon nanoparticles of the invention are important not only because they extend the frequency regime of present laser sources, but because of other reasons. First, the symmetry requirement for SHG is the same as that for piezoelectric materials, thus the silicon nanoparticle microcrystals of the invention may be used as a piezoelectric material. Piezoelectric materials expand or contract under the application of electric fields and are used for motion control. Secondly, because nonlinear emission is coherently related to the incident radiation, collimated, and of width that is basically limited by the bandwidth of the incident radiation, it can provide superior detection capabilities as a biosensing marker, improving the signal to background tremendously. Second harmonic generation is currently being used as a basis for what is called second harmonic imaging (SHIM). In this imaging technique, cells are labeled with membrane-staining dyes that have a large nonlinear optical coefficient. Near infrared light is used to induce a two-photon process in the dye, and the second harmonic in the near UV is detected. Since the incident radiation can be spectrally narrow, so will the second harmonic, allowing good discrimination against background. Finally, the particles are less fragile than ordinary crystalline materials or dyes used in second harmonic generation. They are photostable and do not bleach or blink, and can be readily grown into optically clear crystals. Silicon is also relatively benign for biological testing.

Figure 1:
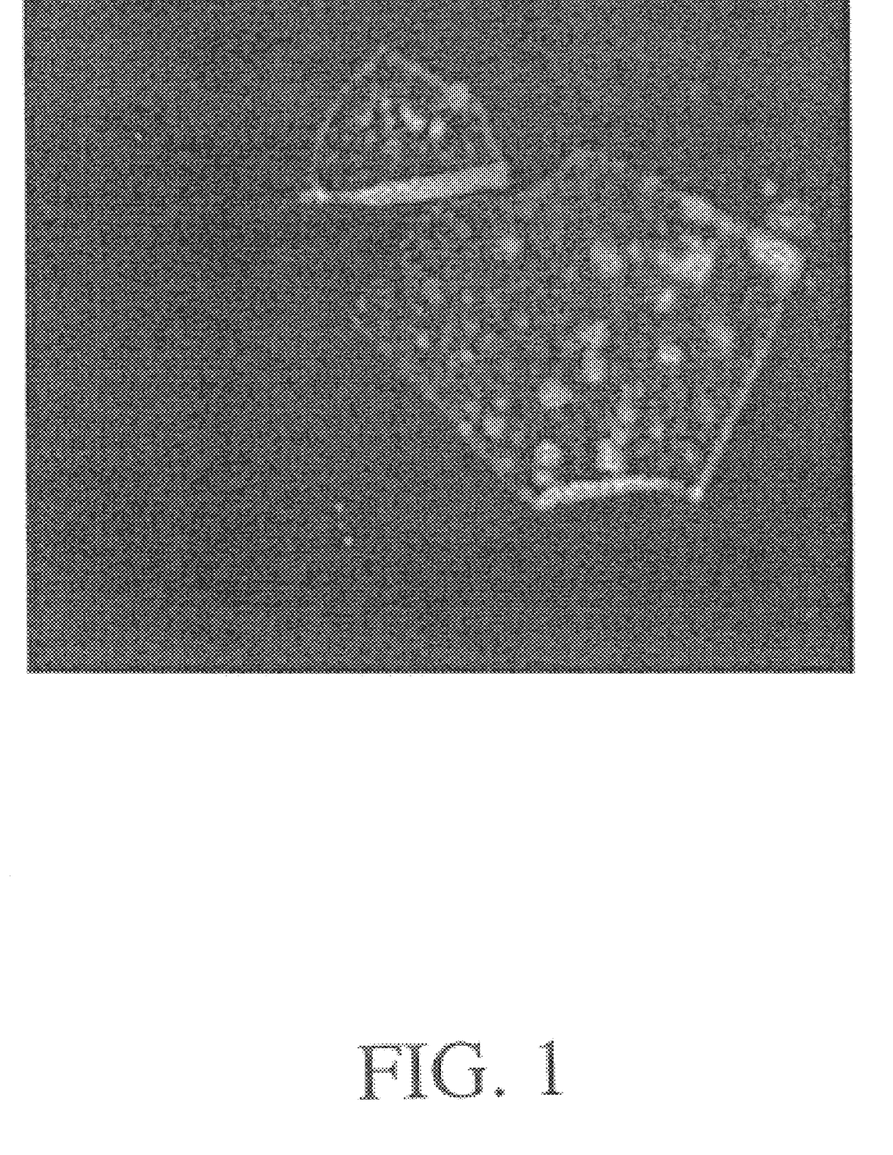
FIG. 1 is an optical image of two silicon nanoparticle microcrystals, each a faceted colloidal crystal of 100 $\mu$m across, formed by precipitation from a water colloid.

The silicon substrates were (100) oriented, 1–10 ohm-cm resistivity, p-type boron doped silicon, laterally anodized in hydrogen peroxide and hydrofluoric acid. Incorporation of the peroxide catalyzes the etching and cleans the material, resulting in much reduced substructures of high chemical and electronic qualities. Silicon nanoparticles are formed by slowly advancing the wafer in the etchent at a (~1 mm per hour) to produce a large meniscus-like area. Subsequent immersion in an ultra-sound acetone or water bath crumbles the top film into ultra-small particles, leaving behind a deep red luminescent bottom layer. In suspension, larger yellowish/orangish luminescent particles precipitate, leaving a stable luminescent bluish colloid. Direct imaging, using high resolution transmission electron microscopy, of a thin graphite grid which was coated with the particles shows that the particles are 1 nm in diameter. Material analysis profiles using electron photo spectroscopy show that the particles are composed of silicon with less than 10 percent oxygen. We then precipitated the particles from a water solvent to reconstitute the material into a thin microcrystal film on a device quality silicon substrate, parafarin or on glass substrates. Optical imaging (see FIG. 1) shows that faceted colloidal silicon nanoparticle microcrystals of several $\mu$m across form in the film.

There are several potential pumping schemes, including (I) Pulsed single photon UV excitation (ii) Pulsed two-photon infrared excitation (iii) Continuous wave (CW) excitation, and (iv) Electron injection. In conducted experiments, to excite emissions from the microcrystals in the film, we used mode locked femto-second Ti-Sapphire near infrared laser, generating pulses of 150 fs duration at a repetition rate of 80 MHZ. At the target, the average power, 5–300 mW, is focused to diffraction limited spots ~1 $\mu$m diameter, using objectives of 0.5 NA, giving an average intensity of $2\times10^5$ to $4\times10^7$ W/cm$^2$ (peak pulse intensity of $2\times10^{10}$–$4\times10^{12}$ W/cm$^2$). The beam-sample interaction region is viewed via an optical microscope(×10) and the excitation light was raster scanned to permit photoluminescence imaging. Emissions were detected by a photomultiplier and stored in a two dimensional array. The spectral response was analyzed with a resolution of 4 A by a grating dispersive element and a charge sensitive detector cooled to zero degrees centigrade to reduce the dark current count.

Silicon nanoparticle microcrystal film was excited by near-infrared femtosecond two photon process ranging from 750 nm to 830 nm with the radiation focussed to ~1 $\mu$m. We have observed a narrow emission at twice the frequency of the incident radiation (half the wavelength). This is the second harmonic of the incident radiation. Moreover, another beam was produced slightly up shifted in frequency from the second harmonic beam. This beam is believed to arise due to stimulated anti-Stokes emission via the Raman scattering process.

Figure 2:
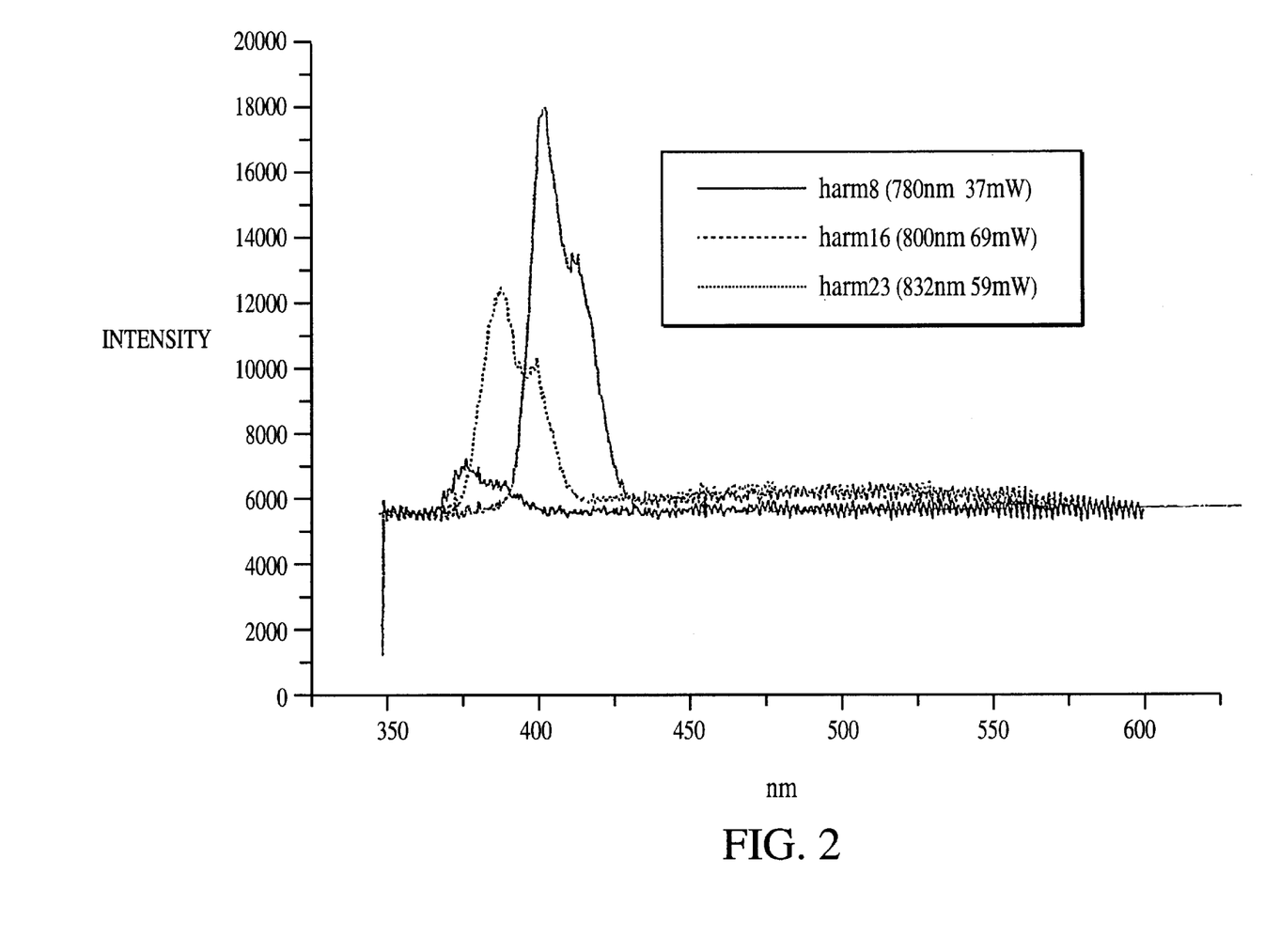
FIG. 2 is the emission spectra of a silicon nanoparticle microcrystal film for three excitation wavelengths of 780, 800, and 832 nm. Each show a peak with a shoulder on the red wing. The shoulders are respectively at 390, 400, 416 nm, half the incident wavelength.

FIG. 2 gives the emission spectra for a silicon nanoparticle microcrystal film at incident excitation wavelengths of 780, 800, and 832 nm. Each shows a peak with a shoulder on the red wing. The shoulders are at 390, 400 and 416 nm, respectively. The shoulder wavelengths are at half the wavelengths of the incident beam. The peaks in the spectra are at 380, 390, and 406 nm, i.e, blue shifted by 10 nm from the shoulder in each spectra. The strong nonlinear response including harmonic generation is expected to be operational from about 600 nm to 1000 nm incident wavelengths.

We now discuss some mechanisms that might provide higher order optical nonlinearity in silicon. One model which might be useful in this regard is exciton-exciton induced anharmonicity due to confinement in the core of the particles. Although this model has been ruled out by theory, calculations show that the nonlinear polarizability of semiconductors may be greatly enhanced, by several order of magnitude, over bulk values when the crystallite size is reduced to the nano meter regime, provided that excitons are bound (binding much larger than the confinement energies of electrons and holes), and that the distance between two excitons is small enough to produce large enough collisional interaction broadening to dominate the excitation lines. The results predict a large enhancement in the case CuCl, for example. However, for systems of large dielectric constants and small effective masses, such as silicon, the excitonic Bohr radius is as large as 4 nm, and the quantization energies of the unbound electron and hole become, in ultrasmall nanoparticles (1 nm across), easily larger than the exciton binding energy so that no bound exciton can be found in the particle, and hence the exciton-exciton interaction vanishes and the conditions do not apply.

Figure 3:
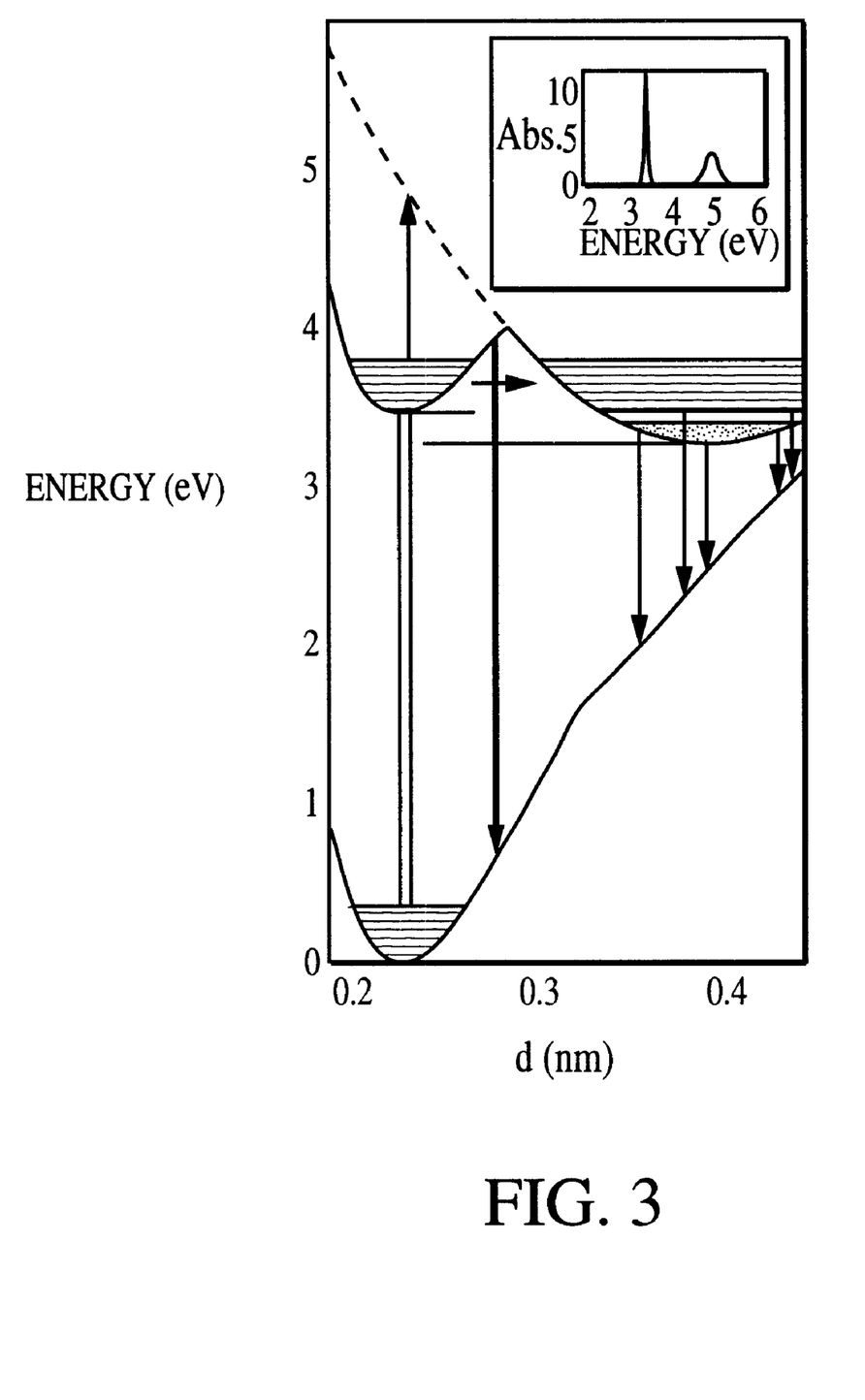
FIG. 3 is a representation of the interatomic potential of the Si—Si bond and the various pathways for absorption and emission in a 1.03 nm diameter silicon nanoparticle whose activity is breaking the centrosymmetry in bulk, allowing the nonlinear optical processes to proceed.

A plausible explanation may be derived from a recent model that is based on first principle calculations. Allan et al theoretically discovered formation, in ultra small nanocrystallites (<1.75 nm), of new stable configuration (or phase), distinct from but interconnected to diamond-like structure by a potential barrier. It is based on pairing of surface atoms to form intrinsic Si—Si dimer bonds that act as self trapped excitons on a single bond. FIG. 3 gives a schematic of the interatomic potential of the bond and the various pathways for absorption and emission in a 1.03 nm diameter particle. The dimer phase may provide an anharmonicity based on ionic motion. To estimate the anharmonicity, we expand the interatomic potential as a function of the bond length (FIG. 3) about the potential minimum. V (r)=ar$^2$+D r$^3$ where r is the displacement from the potential minimum, and the second term is the first anharmonic term. The fit gives mD=$5.1\times10^{13}$ V/m$^3$. The frequency independent nonlinear optical coefficient is $\delta$=mD/2e$^3$N$^2$ where m is the mass of the electron, and N is the density of electrons that contribute to the polarization. The polarization at the second harmonic is therefore P$^{(2\omega)}$=½d$^{(2\omega)}$E$_0^2$ cos 2$\omega$ where d$^{(2\omega)}$=$\delta$($\chi^{(\omega)}$)$^2\chi$ (2$\omega$), and $\chi^{(\omega)}$ is the linear susceptibility at frequency $\omega$. This gives $\delta$=$7\times10^{13}$ mks for N=$6\times10^{28}$/m$^3$. The mean value of the parameter $\delta$ for 25 for noncentrosymmetric crystals known for second harmonic generation is $2\times10^9$. Because the range of absorption of the new dimer phase extends from about 600 nm to 1000 nm, the strong nonlinear response including harmonic generation is expected to be operational for this wavelength.

In the dimer phase, trapping of electron-hole pairs takes place on a single bond, the bond from which the excitation commenced (self-trapping). If trapping is faster than the excitation rate, then neutral channels are favored over charge excitation channels. In systems of center of symmetry such as bulk silicon, the electronic wavefunctions relevant to the processes have well defined parity, since electron-electron interactions are important. In this case, pure electric-dipole based nonlinearity will vanish. In ultrasmall nanoparticles, wavefunctions of different parities are degenerate if the trapping on a single bond is strong. If the different parity states are coherently mixed, then self trapping as provided by the Si—Si dimer phase may break the inversion center and hence the centrosymmetry in Si.

The appearance of a peak in each of the spectra blue shifted by 10 nm from the second harmonic line suggests a higher order nonlinear coherent process such as stimulated anti-Stokes scattering. To explore this, we calculate the characteristic vibrational frequency of the system. We used a numerical matrix method to calculate the vibration structure supported by the potentials of the dimers. The spacing of the lower levels is 42 meV. For incident wavelength of ~780 nm, this vibration energy would produce an anti-Stokes line at 759.4 nm, with a shift of 20.6 nm. If harmonic generation proceeds after the Raman process, this would give a line at 380 nm, with a shift of 10.3 nm. Since the Raman process is a higher order process than second harmonic generation, i.e., cubic versus quadratic succesptibilites in the field amplitude, then the Raman process may indeed be preferred at the highest intensity, i.e., at the primary incident wavelength.

Figure 4:
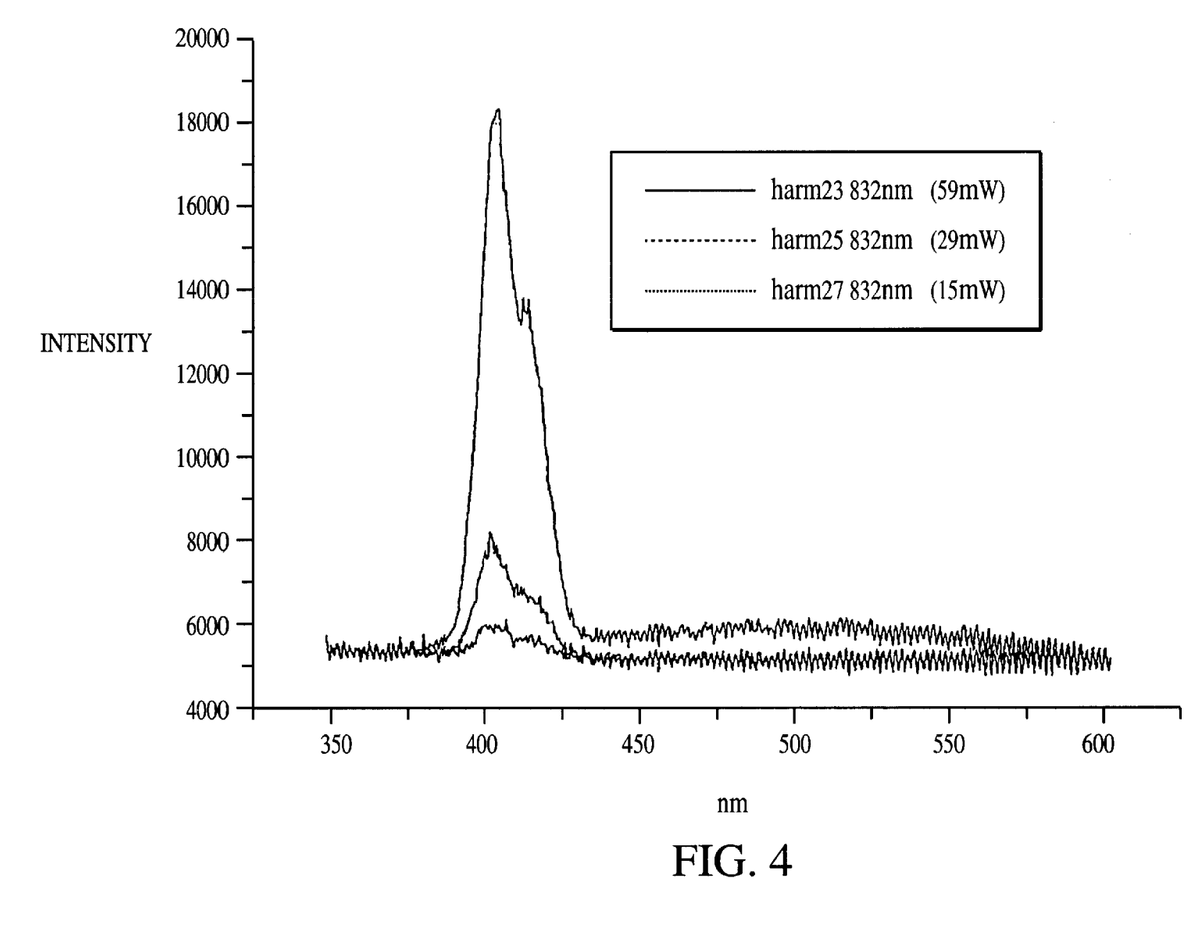
FIG. 4 is emission spectra of a silicon nanoparticle microcrystal film recorded at a given incident wavelength for several incident intensities.
Figure 5A:
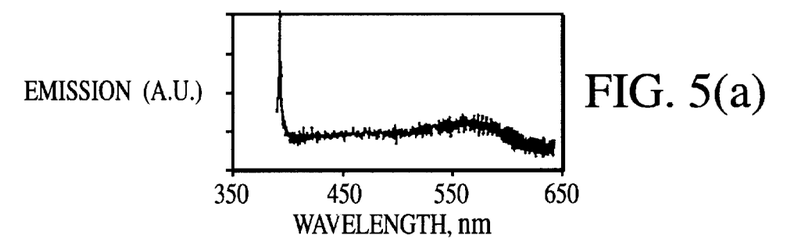
FIGS. 5(a)–(e) shows emission spectra of a silicon nanoparticle microcrystal film showing in general a harmonic peak, a strong blue band at 400–500 nm, and a weaker green/yellow band at 510–625 nm. The harmonic peak anticorrelates with the blue band but it correlates with the green/yellow band.
Figure 5B:
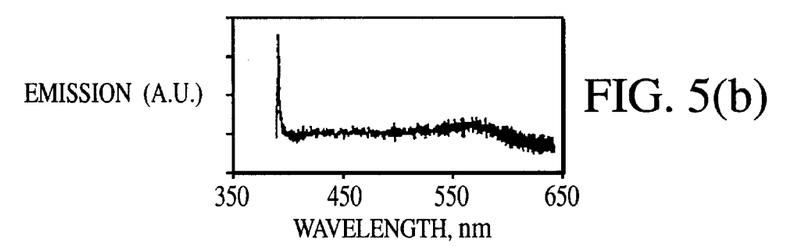
Figure 5C:
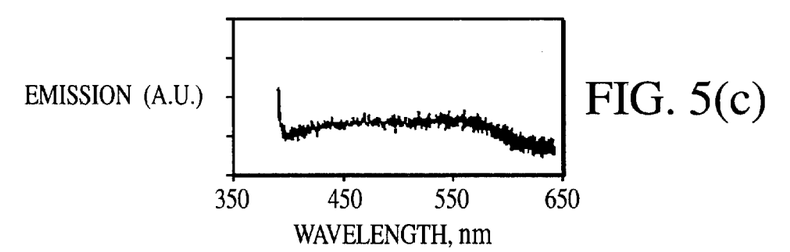
Figure 5D:
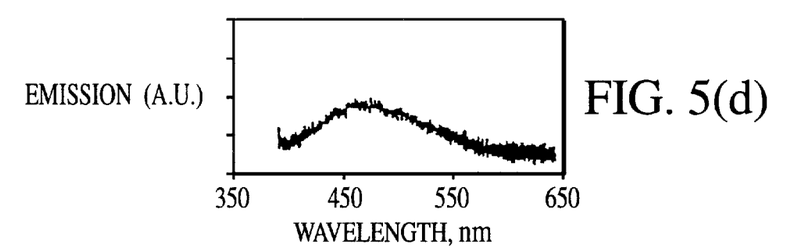
Figure 5E:
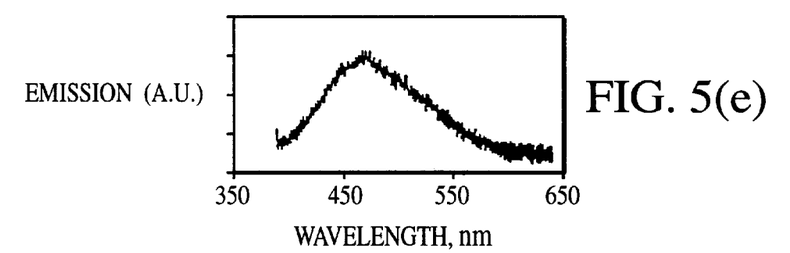

These results point to an unusually ultrahigh Raman gain since the sample is only a few micron thick. Since the Raman gain coefficient is quadratic with incident intensity, the high gain inferred from these observations is not unrealistic under high intensities (in the range $10^{11}$–$10^{12}$ W/cm$^2$). We examined the power dependence of both the second harmonic generation and the Raman scattering. The spectra increasing in strength shown in FIG. 4 were recorded at 15, 29, and 59 mW incident power of 832 nm radiation. Several measurements of the harmonic yield, taken at different wavelengths and spots, show a power dependence between 1 and 2, with 1.5 average, indicating some degree of saturation. The ratio of the unshifted second harmonic to the anti-Stokes is 0.58, 0.60, and 0.65 at respective incident powers of 15, 29, and 59 mW, essentially flat with incident intensity, indicating saturation in this high intensity regime. It is also flat for excitation with the incident wavelength.

It is interesting to note that, despite the high incident intensity, there are no Stokes shifted peaks on the red side of the harmonic peak. This is surprising since emission at the Stokes lines are expected to be more efficient than that at anti-Stokes lines. A detailed analysis is needed to explain the intensity ratios especially the absence of the stokes line. A complete solution of the combined harmonic generation-Raman scattering problem is needed. It requires a simultaneous solution of Maxwell equations, and the vibration equation that involve all the relevant frequency components, in addition to the feedback by the silicon substrate. We should note that the detector configuration is such that the measured emission is in the backscattering direction. Moreover, the microcrystal film is on a high quality silicon substrate which provides a reflectivity of ~0.5 at 400 nm, and 0.4 at 780 nm. Thus it is not clear how much of the emission is direct backscattering or reflected forward scattering. Because the gain of Raman scattering is quadratic with intensity, then, in general, Stokes emission would scatter much more strongly than the weaker anti-Stokes emission would. Finally, the vibration energy of the Si—Si dimer vibrations, 42 meV, is only 1.75 times the thermal energy, hence the v=1 state is expected to initially have 0.143 of the overall population. Since for the first anti-Stokes process to proceed the dimer must be in the excited v=1 vibrational level, this substantial thermal population allows the anti-Stokes process to proceed at the early stages of the interaction. Otherwise the process would rely completely on the population of the v=1 state by the internally generated Stokes radiation.

There is also an interesting relationship between the harmonic peak and the photoluminescence. The spectra in FIGS. 2–3 show strong harmonic generation with very weak photoluminescence. Spectra in general, however, have a harmonic peak, a strong blue band in the range 400–500 nm, and a weaker green/yellow band in the range 510–625 nm. FIGS. 5(a)–5(e) show that the harmonic peak anticorrelates with the blue band but it correlates with the green/yellow band. For instance, when the harmonic generation proceeds, the blue band is inhibited, but the green band is emitted, and the opposite is true.

Figure 6:
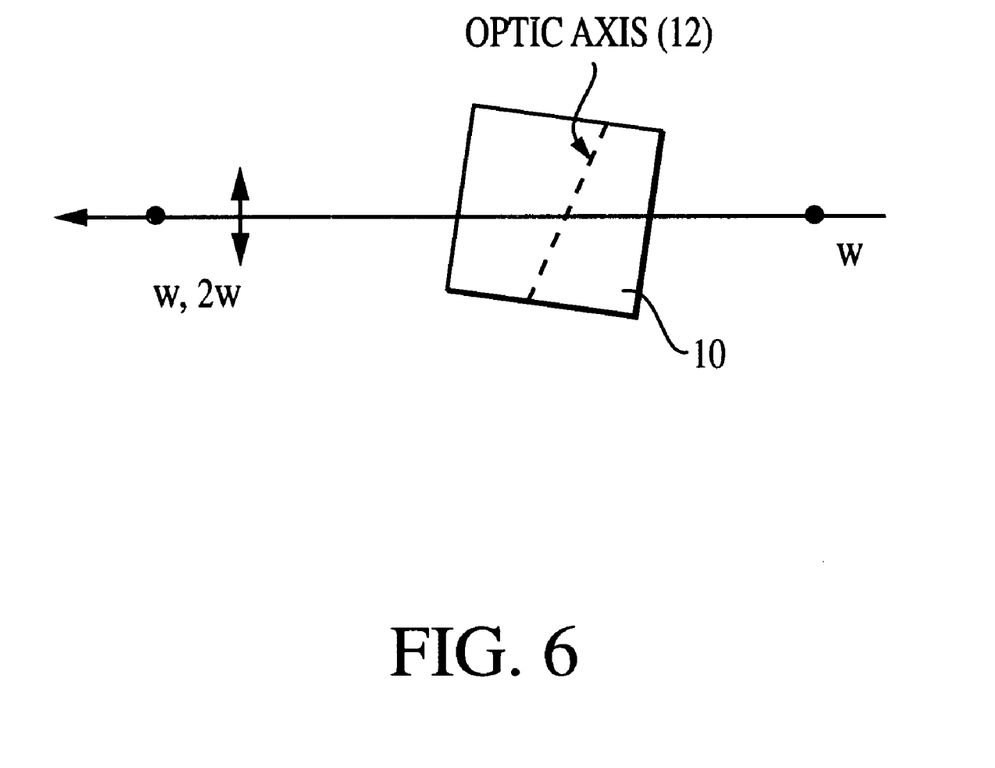
FIG. 6 illustrates the geometry of a frequency doubler of the invention constructed from a silicon nanoparticle microcrystal.
Figure 7:
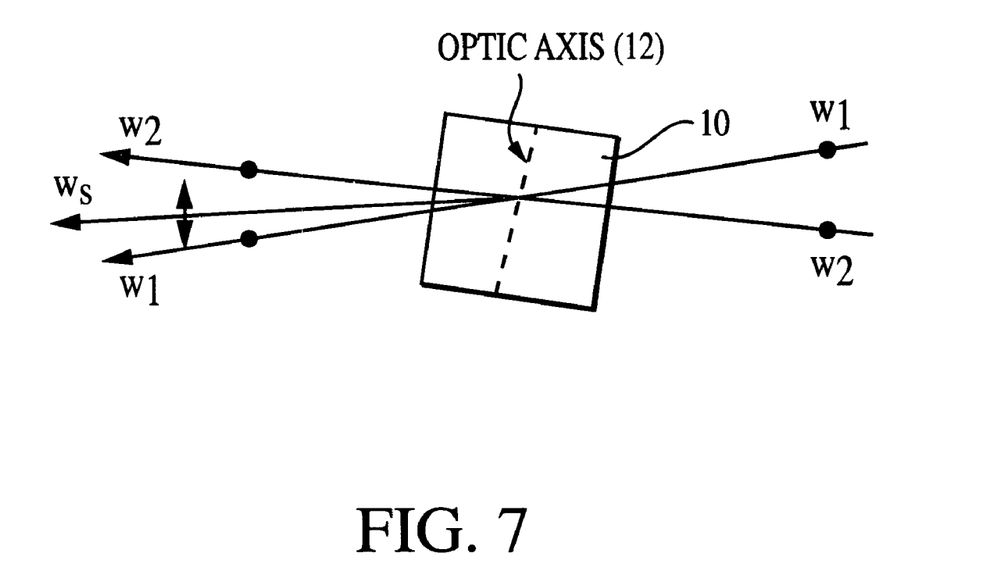
FIG. 7 illustrates the geometry of a frequency mixer of the invention constructed from a silicon nanoparticle microcrystal.

A frequency doubler of the invention is shown in FIG. 6. A silicon nanoparticle microcrystal 10 has an optic axis 12 oriented as shown. Dots indicate polarization out of the plane of the page, and arrows indicate polarization in the plane of the page. An incident beam ω traverses the microcrystal 10. The relative orientation between the beam ω and the optic axis 12 is varied to locate the depicted orientation that results in the emission of the beam at frequency 2ω. A frequency mixer geometry is shown in FIG. 7. In this case, the incident beams at $\omega_1$ and $\omega_2$ traverse the microcrystal 10 in a near collinear configuration. The relative orientation between the optic axis 12 and the incident beams is varied to locate an orientation of a mixed beam at $\omega_1+\omega_2$.

Nonlinear optical processes in the silicon nanoparticles of the invention are important not only because they extend the frequency regime of present laser sources, but because of other reasons. First, the symmetry requirement for SHG is the same as that for piezoelectric materials, thus the silicon nanoparticles of the invention may be used as a piezoelectric material. Piezoelectric materials expand or contract under the application of electric fields. Thus, they are used for motion control. Secondly, because nonlinear emission is coherently related to the incident, collimated, and of width that is basically limited by the bandwidth of the incident radiation, it can provide superior detection capabilities as a biosensing marker, improving the signal to background tremendously when used in biosensing. Finally, the particles are less fragile than ordinary crystalline materials used in second harmonic generation. The conventional materials are hydrophilic, requiring encapsulation to insulate from ambient effects, and are easily damaged by incident laser power, or thermal effects. The silicon-based material is photostable and do not bleach or blink, and can be readily grown into optically clear crystals.

The optical nonlinearity of the silicon nanoparticle microcrystals is suitable in applications to measure external electric fields in general and fields within the body of microelectronics and power microelectronics devices. A device like that shown in FIG. 8, including silicon nanoparticle crystals implanted between the gate area of a semiconductor transistor 14, can be used as an electrochromatic mapping device of field distributions in the transistor 14. Similar incorporation into other devices also provides a diagnostic tool. The particle response to external electric fields may be useful as a diagnostic tool of the imposed electric field. The frequency, width, and excitation efficiency of the excitonic transitions in the particles, hence the width, and excitation efficiency of excitonic transitions in the particles and the optical properties of the particles 10 are sensitive to electric fields of strengths from about $2\times10^5$ to $2\times10^6$ V/cm. These field strengths are common in electronic power devices. Silicon nanoparticle microcrystallite films provide an implanted electrochromatic medium to map the electric field strength in all types of devices.

Figure 8:
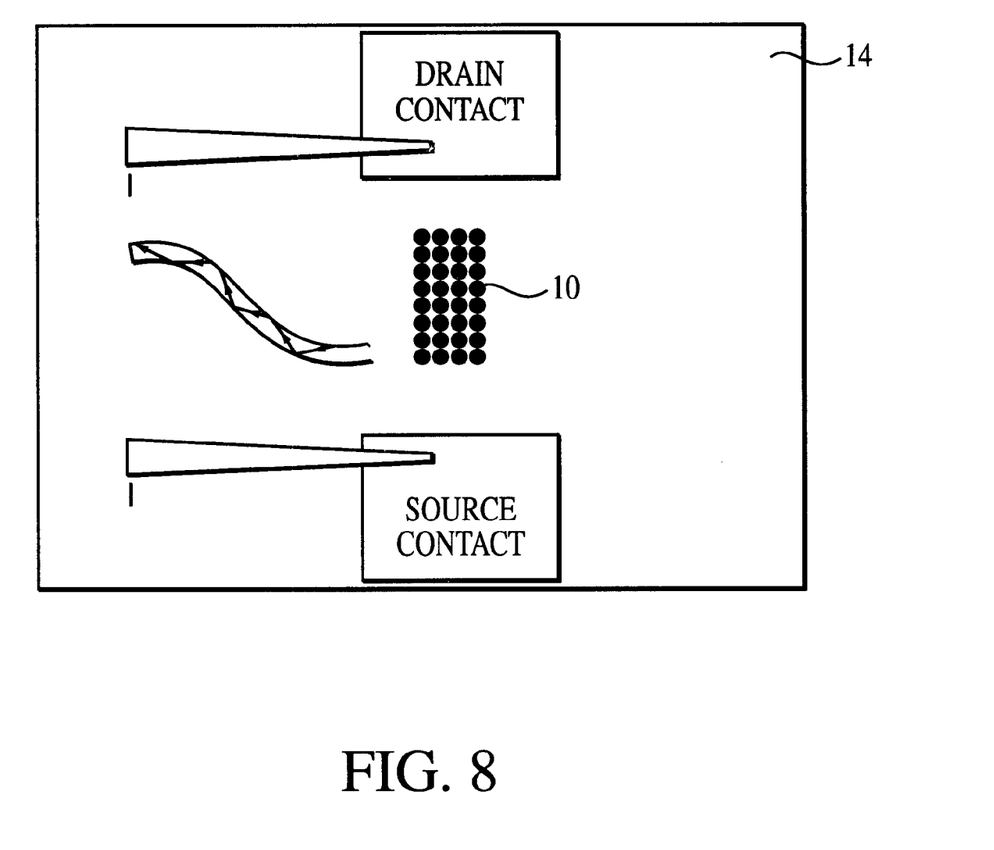
FIG. 8 illustrates an electrical field measurement device of the invention which measures field through electrochromatic effect in a semiconductor device incorporating silicon nanoparticle microcrystal film.

In the transistor 14 of FIG. 8, the silicon nanoparticles 10 serve to diagnose the gate materials of the transistor. Gate materials in field effect transistors are subjected to fields in excess of 1 MV/cm. The double diffused (DMOS) transistors are capable of high voltage and high current (about 50 A), and include a short channel of 1–2 μm. Channel widths are typically on the order of $10^5$ μm. Despite the short channel, the DMOS breakdown voltage can be as high as 600V. At high biasing voltages, the $i_D$-$v_{GS}$ characteristics show a regime where the response is linear as a result of a high electric field along the short channel. Stresses will increase if the DMOS technology is to become smaller for improvement of computer, communication and information industry applications. Such improvements will require careful testing of breakdown levels to avoid design shortfalls. Standard stress tests use planar capacitor geometry. Severe damage is initiated when the fields surpass a threshold. However, such a test falls short of real operating conditions, which can present different field distributions leading to different permanent degradation conditions.

Electrochromatic materials are materials whose luminescence changes in color and intensity as a result of changes in the strength of an imposed electric fields. Placement of the electrochromatic silicon nanoparticle microcrystals provides the opportunity to map electric field in devices. According to the Dow-Redfield and Franz-Keldysh theories, the frequency, width, and excitation efficiency of excitonic transitions in amorphous semiconductors are sensitive to the strength of an imposed electric field near about 1 MV/cm. The theory demonstrates several orders of magnitude enhancement of excitonic absorption as the field rises from $2\times10^6$ to $20\times10^6$ V/cm, for example.

Accordingly, the intensity and spectral distribution of the photoluminescence from a silicon nanoparticle microcrystal film 10 in the transistor 14 of FIG. 8 will vary as a function of biasing and current in the transistor 14. Experiments described above, and extrapolation calculations from the experiments show that the nanoparticle microcrystal film 10 will emit in response to excitation from about 600 nm–1000 nm. For example, a near infrared two photo excitation, a mode locked femto-second Ti-Sapphire near infrared laser (780 nm), generating pulses of 150 fs duration at a repetition rate of 80 MHZ is suitable. At the target microcrystals 10 in the transistor 14, an average power of about 5–300 mW is focused to diffraction limited spots of about 0.5 $\mu$m diameter, using objectives of 0.5 NA, giving an average (or CW) intensity of $2\times10^5$ to $4\times10^7$ W/cm² (teak pulse intensity of $2\times10^{10}$–$4\times10^{12}$ W/cm²). The beam-sample interaction region may be viewed by an optical microscope (10×) and the excitation light is raster scanned allowing photoluminescence imaging. Emission is preferably detected by a photomultiplier and stored in a two dimensional array. Spectra are analyzed by a grating dispersive element and a charge sensitive detector. Fiber optics may be used to transport the emission to a CCD. Because the repetition rate of the laser can be varied down to about 1 MHZ, dynamic studies are enabled. Spectral changes in the brightness of the silicon nanoparticle microcrystals 10 can be monitored according to changing transistor biasing voltage. Spectral changes may be subtle, but the particles should glow in an intense electric field and dim in a weaker field providing a convenient and direct observation and mapping of the field distribution. The process may also allow examination of time dependence of the electric field, hence a determination of whether or not the device/IC is functioning properly.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A nonlinear optical device for accepting excitation at a given frequency and emitting harmonics of the given frequency, the device comprising:

a silicon nanoparticle microcrystal, said microcrystal emitting a beam of the second harmonic of incident radiation beam when the incident radiation beam is in a range of incident radiation having a wavelength from about 600–1000 nm, and emitting another beam up shifted from a frequency of the second harmonic of incident radiation.

2. The device of claim 1, wherein said microcrystal is part of a microcrystal film formed on a substrate.

3. The device of claim 2, wherein said substrate comprises a silicon substrate.

4. The device of claim 2, wherein said substrate comprises a glass substrate.

5. The device of claim 2, wherein said substrate comprises a parafarin substrate.

6. A method for second harmonic imaging, the method comprising:

labeling biological cells with crystallized silicon nanoparticle microcrystal material;

subjecting a host including labeled biological cells to incident radiation;

detecting the second harmonic of the incident radiation.

7. A method of monitoring electric fields, the method comprising steps of:

placing silicon nanoparticle microcrystal film in an area of interest;

subjecting the microcrystal film to incident radiation;

monitoring emissions from the microcrystal film to determine an electrical field strength in the area of interest.

8. The method according to claim 7, wherein the area of interest is a region of a semiconductor device.

9. The method according to claim 7, further comprising a step of monitoring conditions of the semiconductor device and correlating such conditions to the electric field.

* * * * *